United States Patent
Miller (10) Patent No.: US 6,965,248 B2
(45) Date of Patent: Nov. 15, 2005

(54) COMPENSATION FOR TEST SIGNAL DEGRADATION DUE TO DUT FAULT

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 27 days.

(21) Appl. No.: 10/979,059

(22) Filed: Nov. 1, 2004

(65) Prior Publication Data

US 2005/0088169 A1 Apr. 28, 2005

Related U.S. Application Data

(62) Division of application No. 10/193,831, filed on Jul. 12, 2002, now Pat. No. 6,812,691.

(51) Int. Cl.[7] .............................................. G01R 31/26
(52) U.S. Cl. .................................. 324/765; 324/158.1
(58) Field of Search ............................... 324/537, 754, 324/765, 73.1, 158.1; 714/724, 740, 819, 714/820

(56) References Cited

U.S. PATENT DOCUMENTS 5,101,153 A * 3/1992 Morong, III ................. 324/537
6,028,438 A * 2/2000 Gillette ........................ 324/765

* cited by examiner

Primary Examiner—Vinh Nguyen
Assistant Examiner—Russell M. Kobert
(74) Attorney, Agent, or Firm—Stuart L. Merkadeau (57) ABSTRACT

An electronic device tester channel transmits a single test signal to multiple terminals of electronic devices under test (DUTs) through a set of isolation resistors. The tester channel employs feedback to automatically adjust the test signal voltage to compensate for affects of faults at any of the DUT terminals to prevent the faults from substantially affecting the test signal voltage.

8 Claims, 9 Drawing Sheets

COMPENSATION FOR TEST SIGNAL DEGRADATION DUE TO DUT FAULT

RELATED APPLICATIONS

This is a divisional of U.S. application Ser. No. 10/193,831, filed Jul. 12, 2002, now U.S. Pat. No. 6,812,691.

BACKGROUND OF THE INVENTION

1. Field of the Invention

The present invention relates in general to an electronics device tester that transmits a test signal to multiple terminals of devices under test (DUTs), and in particular to a system for compensating for test signal degradation.

2. Description of Related Art

Figures 1, 2:
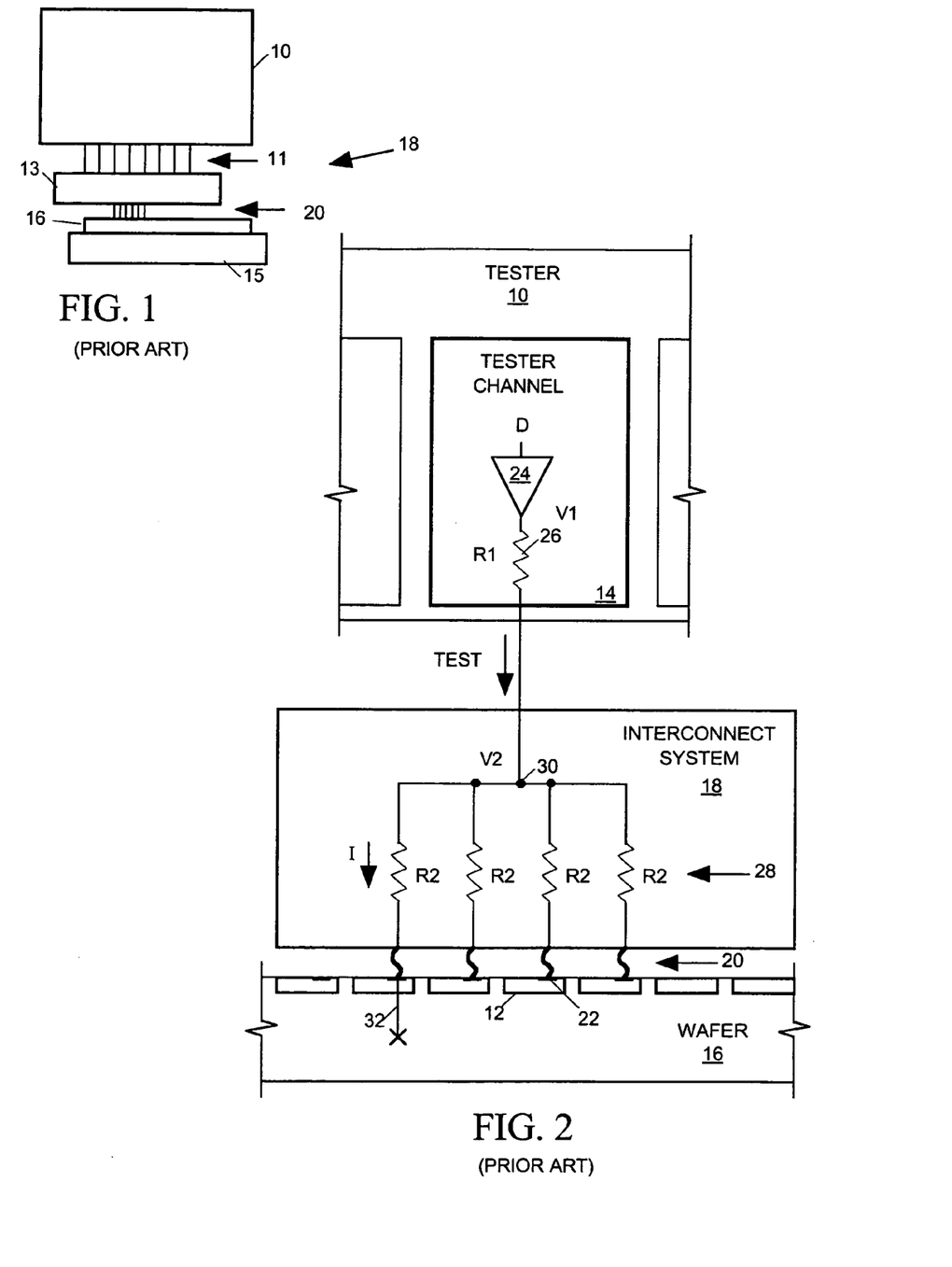
FIG. 1 is a simplified side elevation view of a prior integrated circuit (IC) tester accessing an set of ICs formed on a wafer via an interconnect system.
FIG. 2 is a schematic diagram illustrating a portion of one channel of the tester of FIG. 1 transmitting a test signal to a set of IC terminals on the wafer of FIG. 1 via signal paths provided by the interconnect system of FIG. 1.

As illustrated in FIGS. 1 and 2, a prior art integrated circuit (IC) tester 10 tests a set of digital IC DUTs 12 before they are separated from the semiconductor wafer 16 on which they are formed by using an interconnect system 18 linking tester 10 to a set of probes 20 providing signal access to terminals 22 on the surfaces of the ICs. IC tester 10 includes a set of tester channels 14, each capable of transmitting a digital test signal to an IC terminal or sampling a digital response signal produced at the IC terminal to determine its state. Interconnect system 18 includes a set of pogo pins 11 or other type of connectors for linking input/output terminals of each tester channel 14 to a probe board assembly 13. Probe board assembly 13 includes one or more substrate layers containing conductive traces and vias forming signal paths between pogo pins 11 and probes 20.

Since a semiconductor wafer 16 can hold a large number of ICs, and since each IC can have a large number of terminal pads, an IC tester 10 employing a separate channel to access each IC terminal would require a very large number of channels 14 to concurrently test all ICs on a wafer. Therefore an IC tester 10 usually tests only a portion of the ICs on a wafer 16 at the same time. Wafer 16 is typically mounted on a chuck 15 which positions wafer 16 so that probes 20 contact the terminals 22 of a particular set of ICs 12 to be tested. After tester 10 has tested that set of ICs 12, chuck 15 repositions wafer 16 so that probes 20 contact terminals 22 of a next set of ICs to be tested.

To speed up the testing process, it is helpful to maximize the number of concurrently tested ICs 22. As described in U.S. patent application Ser. No. 10/142,549 entitled "Test Signal Distribution System for IC Tester, filed May 8, 2002", incorporated herein by reference, one way to increase the number of ICs a tester can concurrently tests is to apply the test signal output of one channel to more than one IC input terminal. For example, when each IC to be tested is a random access memory (RAM) addressed by an 8-bit word, then each of a set of eight tester channels can concurrently send addresses to several RAMs, since all RAMs are to receive the same address sequence during the test.

Although interconnect system 18 provides paths for conveying signals in both directions between many tester channels 14 and IC terminals 22, FIG. 2 illustrates only a portion of one tester channel 14 linked by interconnect system 18 to several terminals 22 of ICs 12 on wafer 16. A driver 24, responding to control circuits (not shown) within channel 14, generates an output signal of voltage V1. A resistance 26 of magnitude R1 links the driver's output signal V1 to a node 30 of interconnect system 18 to produce a test signal at node 30 of voltage V2. Resistance 26 includes the output resistance of driver 24 and any resistance in the path between the driver output and node 30.

Interconnect system 18 distributes the test signal developed at node 30 to a set of probes 20 through a network of isolation resistors 28, each of resistance R2. When made sufficiently large, isolation resistors 28 resistively isolate terminals 22 from one another to prevent a fault 32 to ground or to any other source of potential at the terminal 22 at any of one or more of ICs 12 from driving the other IC terminals 22 to the fault potential regardless of the voltage V1 at the output of driver 24. Isolation resistors 28 enable tester 10 to test ICs 12 having no faults at their terminals when ICs receiving the same test signal do have faults at their terminals. Although FIG. 2 shows isolation resistors 28 as forming a simple parallel network, as discussed in the previously mentioned U.S. patent application Ser. No. 10/142,549, resistors 28 may be arranged in other network topologies. Other nonlimiting examples are shown in U.S. patent application Ser. No. 09/613,531, filed Jul. 10, 2000.

The number of IC terminals 22 that a single tester channel 14 can drive is limited in part by the ability of driver 24 to maintain adequate test signal voltage at IC terminals 22 that are not experiencing faults when one or more other IC terminals 22 are experiencing faults. The input impedance at IC terminals 22 is primarily capacitive and they normally draw little steady state current after the test signal has had time to charge or discharge the IC terminal capacitance following a test signal state change. Thus under steady state conditions, the voltage appearing at each IC terminal 22 not experiencing a fault is substantially equal to V2. When driver 24 changes its output voltage V1 to a high or low logic level in response to a state change in an input "drive" control signal D, the test signal voltage V2 at node 30 at the junction of isolation resistors 28 rises or falls to steady state high or low logic voltage level that is substantially equal to V2 after the test signal current has fully charged or discharged the capacitance at IC terminals 22. The slew of the test signal is a function of the IC terminal capacitance and of the resistances in the signal paths between driver 24 and terminals 22.

When there is a fault 32 connecting the terminal 22 of one of ICs 12, for example, to a source of low logic potential VL, then when driver 24 drives V1 from a low logic level VL to a high logic level VH, the voltage V2 at node 30 and at the terminals 22 not experiencing faults rise to $$V2 = VH - I*R1$$

$$V2 = VH - (VL - VH)*R1/(R1 + R2)$$

where I is the steady state fault current drawn by fault 32. In a "worst case" situation, where driver 24 is connected to N+1 IC terminals 22, N of those terminals could be linked by faults to a source of low logic level VL. In such case the steady state test signal voltage V2 at 30, and at the single remaining terminal 22 not experiencing a fault is $$V2 = VH - (VL - VH)*R1/(R1 + (R2/N)) \qquad [1]$$

Suppose faults link N of the N+1 terminals 22 to a source of high logic level VH at a time when driver 24 is pulling V1 to low logic level VL. In that case the steady state test signal voltage V2 at node 30 and at the single IC terminal 22 not subjected to a fault will be $$V2 = VL + (VH - VL)*R1/(R1 + (R2/N)) \qquad [2]$$

Equations [1] and [2] show that faults at any set of N IC terminals 22 can pull an IC terminal not subjected to faults above low logic level VL or below the high logic level VH in accordance with the ratio R1/(R1+(R2/N)). When faults pull the test signal voltage at terminals 22 too far above VL or to far below VH, the IC 12 having no fault at its terminal 22 will not recognize the logic state of the test signal and will therefore be untestable.

However the test system can be made fault tolerant when the resistance R2 of isolation resistors 28 is made sufficiently large. Equations [1] and [2] show that increasing the size of R2 reduces the influence of faults on test signal voltage on voltage V2 so that it can rise or fall closer to VH or VL. As the number N+1 of IC terminals 22 driven by the same test signal and the maximum number N of faults that must be tolerated increase, so too must the magnitude R2 of isolation resistors 28 in order to render the test system fault tolerant.

But increasing the magnitude of isolation resistance R2 reduces the rate at which driver 24 can charge or discharge the capacitance at IC terminals 22 when the test signal changes state. This in turn increases the amount of time the test signal needs to change state, and therefore decreases the maximum frequency at which the test signal can operate. Thus when we increase R2 to increase the number of terminals 22 that can be driven by a single test signal, we reach a limit that is a function of the maximum operating frequency of the test signal. Therefore the number of IC terminals that can be concurrently driven by the same test signal in a fault tolerant manner is inversely related to the maximum frequency of the test signal.

What is needed is a way to further increase the number of IC terminals that can be driven by a single test signal without reducing the maximum operating frequency of the test signal.

BRIEF SUMMARY OF THE INVENTION

An output signal of a driver within a tester channel is resistively linked to circuit node of an interconnect system to produce a test signal at the circuit. The interconnect system distributes the test signal to terminals of a set of ICs to be tested though a network of isolation resistors so that all of the IC terminals are concurrently driven by the same test signal.

A feedback system monitors the test signal voltage and adjusts the driver output signal voltage as necessary to compensate for changes in test signal voltage resulting from faults at one or more of the IC terminals. When the test signal is to drive the IC terminal to a high logic level, the test signal is initially set to a voltage substantially higher than the high logic level to quickly charge the capacitance at the IC terminals. As the IC terminal voltage approaches the desired high logic level, the test signal voltage is reduced to the level needed to maintain a steady state high logic level at the IC terminals. Conversely, when the test signal is to drive the IC terminal to a low logic level, the test signal voltage is initially driven substantially lower than the desired low logic level to quickly discharge the capacitance at the IC terminals, and then increased to an appropriate steady state level needed to maintain the IC terminal voltage at the desired low logic level. A test signal shaped in such manner allows the test signal to operate at higher frequencies for a given isolation resistance than would otherwise be possible for a conventional square wave test signal.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIG. 4 is a timing diagram illustrating behavior of signals V2 and D or FIG. 3, FIGS. 5–7 are timing diagrams illustrating behavior of signal V1 of FIG. 3 under various fault conditions at the IC terminals.

DETAILED DESCRIPTION OF EXEMPLARY EMBODIMENTS OF THE INVENTION

The present invention is directed to a system for concurrently distributing a single test signal to more than one terminal of a set of electronic devices under test (DUTs) such as, for example, integrated circuits (ICs). The following specification describes one or more exemplary embodiments and/or applications of the invention considered by the applicant(s) to be the best modes of practicing the invention. Although the embodiments described herein depict one or more examples of the invention, it is not intended that the invention be limited to such exemplary embodiment(s) or to the manner in which the embodiments operate.

Figure 3:
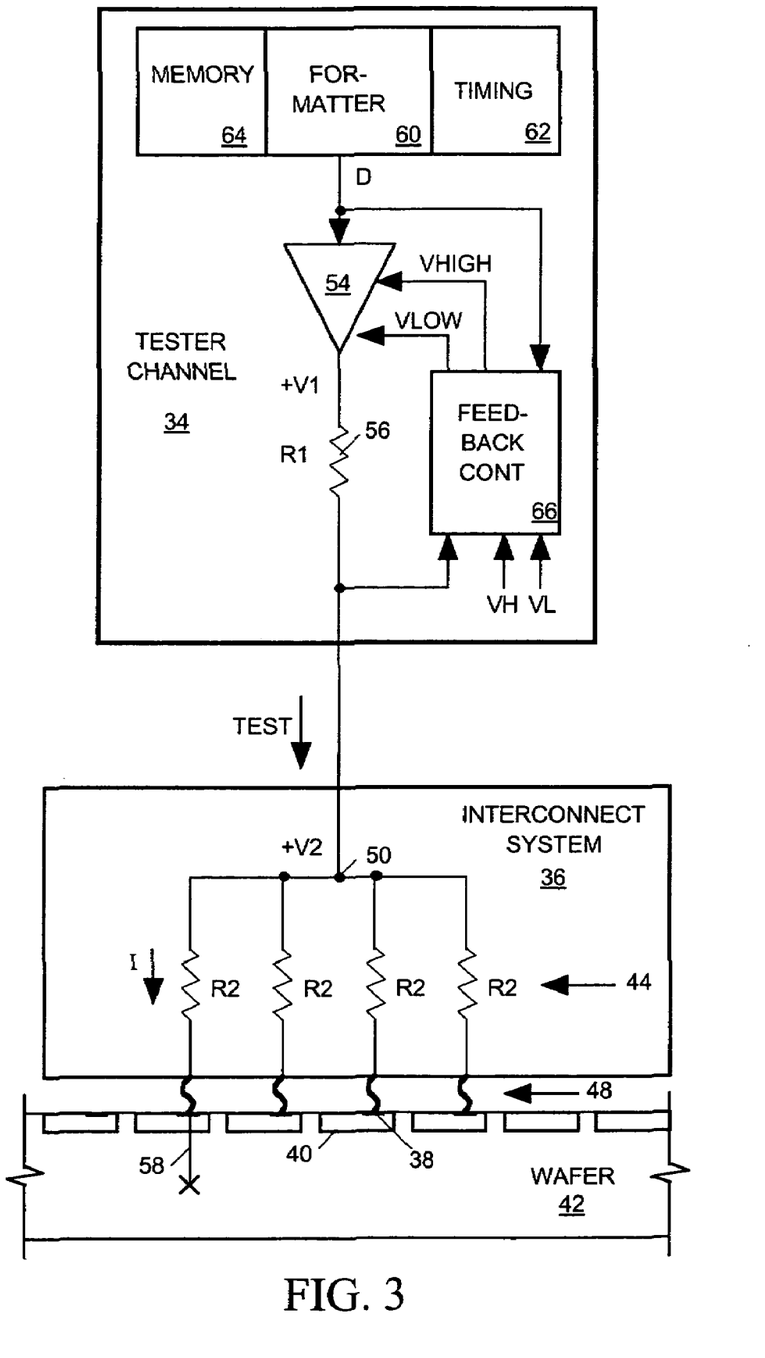
FIG. 3 is a schematic diagram illustrating a portion of one channel of the tester in accordance with a first exemplary embodiment of the invention for transmitting a test signal to a set of IC terminals on a wafer via signals paths provided by an interconnect system.

FIG. 3 illustrates a single channel 34 of a multiple-channel IC tester linked through an interconnect system 36 to several similar terminals 38 of a set of ICs 40 formed on a semiconductor wafer 42 so that the same test signal can concurrently drive each of IC terminals 38. A driver 54 within tester channel 34 supplies the test signal through an output impedance and path impedance represented by a resistor 56 of resistance R1 to a node 50 within interconnect system 36. Interconnect system 36 includes a set of isolation resistors 44 of similar resistance R2, each linking node 50 to a separate probe 48, each probe accessing a separate one of IC terminals 38.

A test is organized into a succession of test cycles, during each of which driver 54 may drive the test signal to a high logic level VH or a low logic level VL in response to a drive control signal D generated by a conventional formatter circuit 60. Before the start of each test cycle, as indicated by a signal from a timing circuit 62, formatter 60 obtains data from a memory 64 indicating whether the test signal is to be driven high or low during the next test cycle. Formatter 60 then sets its output drive control signal D to the appropriate state during the following test cycle and driver 54 responds accordingly by driving the test signal high or low.

The isolation resistors 44 within interconnect system 36 prevent a low impedance fault 58 linking any IC terminal 38 to ground or any other source of potential from driving every other IC terminal 38 to that potential regardless of the magnitude of the output signal voltage V1 of driver 54. When R2 is not sufficiently high, faults at terminals 38 of one or more of ICs 40 can pull the test signal voltage arriving at IC terminals 38 of other ICs outside acceptable ranges for test signal high or low logic levels, thereby invalidating tests conducted on the ICs 40 not experiencing faults.

The minimum resistance R2 of isolation resistors needed to render the test system fault tolerant is a function of the number of IC terminals 38 to be concurrently driven by the test signal. As the number of IC terminals 38 driven by the test signals increases, so to must the magnitude of isolation resistance R2 needed to provide fault tolerance. However the high values of isolation resistance R2 needed to provide fault tolerance when the test signal concurrently drives many IC terminals 30 tends to reduce the test signal current needed to charge and discharge IC terminal capacitance when the test signal changes state. A reduction in charging current decreases the rate at which the test signal can change state, thereby lowering maximum frequency at which the test signal can operate.

In order to compensate for reduction in test signal charging current caused by large values of isolation resistance R2, tester channel 34 includes a feedback control circuit 66 which monitors both the test signal voltage V2 at node 50 and the D input to driver 54. When the D input indicates that the test signal voltage V2 is to be driven to its high logic level VH, feedback circuit 66 compares V2 to a VH level reference voltage and adjusts an output voltage VHIGH supplied to driver 54 as a reference for controlling the high logic level of driver output V1. Feedback control circuit 66 adjusts VHIGH to drive the test signal voltage V2 to the desired high logic level VH. Similarly, when the D input indicates that test signal voltage V2 is to be of low logic level VL, feedback control circuit 66 compares the test signal voltage V2 to a VL level reference voltage and adjusts an output voltage VLOW driver 54 uses as a reference when setting the voltage of its output signal V1. Feedback circuit 66 sets VLOW to drive the test signal voltage V2 to the desired low logic level VL.

Figure 4:
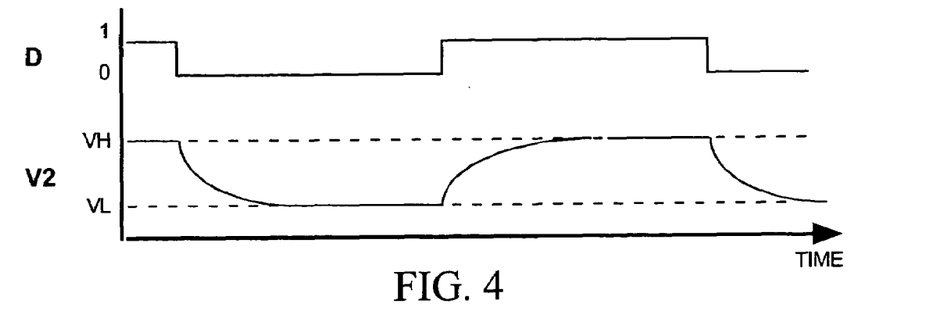

FIG. 4 illustrates how test signal voltage V2 responds to changes in the D control signal input to driver 54 of FIG. 3. When the D signal switches to a 0 logic state, the V2 signal voltage falls to a steady state low logic level VL, and when the D signal switches to a 1 logic state, the V2 signal rises up to a steady state high logic level VH.

Figure 5:
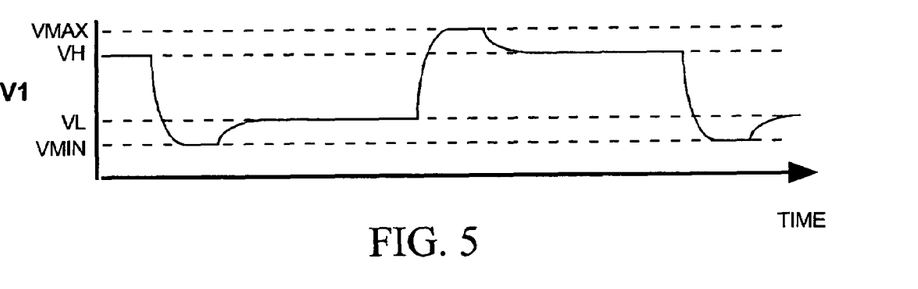

FIG. 5 illustrates how the output voltage V1 of driver 54 signal behaves when producing the test signal V2 of FIG. 4 in the absence of any faults at IC terminals 38. When the D signal transitions from a 1 to a 0, feedback control circuit 66 senses that V2 is substantially higher than the desired low logic level VL, so it initially sets VLOW to signal driver to 54 quickly drive V1 to its lowest possible voltage level VMIN, thereby quickly removing charge from the IC terminal capacitance and pulling test signal voltage V2 down. As V2 approaches VL, feedback controller 66 raises reference voltage VLOW to allow V2 to settle to its steady state, low logic level VL. Similarly, when the D control signal transitions from a 0 to a 1, feedback control circuit 66 senses that test signal voltage V2 is substantially lower than the desired high logic level VH and therefore sets VHIGH to signal driver 54 to quickly pull V1 up to its highest voltage level VMAX to quickly charge the IC terminal capacitance, thereby quickly pulling up test signal voltage V2. As test signal voltage V2 approaches the desired high logic level VH, feedback controller 66 decreases VHIGH to allow V2 to settle to its desired steady state level VH.

Figure 6:
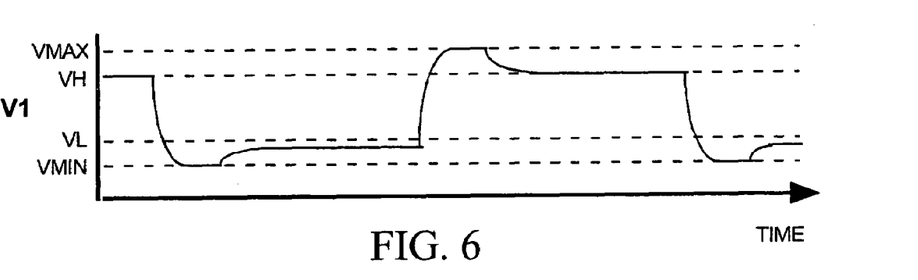

FIG. 6 illustrates the behavior of driver output signal V1 when there is a high logic level fault at an IC terminal 38 tending to pull node 50 toward VH. The behavior of driver output signal V1 depicted in FIG. 6 is similar to the V1 signal behavior depicted in FIG. 5, except that when control signal D transitions to a 0, feedback controller 66 sets the steady state value of VLOW so that driver 54 drives V1 to a steady state magnitude somewhat lower than VL in order to keep V2 at the appropriate low logic level VL. This lower magnitude of V1 compensates for the effects of the high level fault on the test signal voltage V2.

Figure 7:
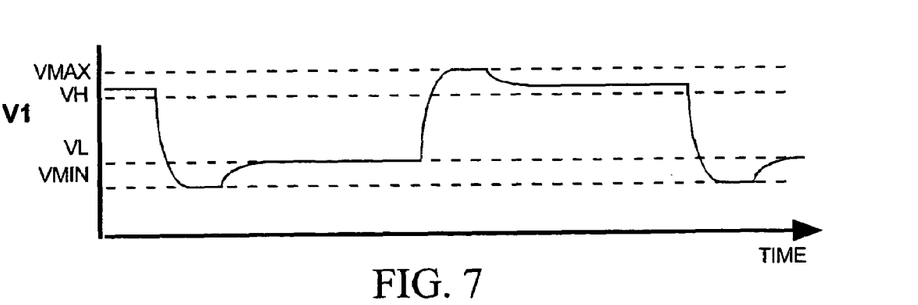

FIG. 7 illustrates the behavior of the V1 signal when there is a fault at one or more at IC terminals 38 tending to pull the test signal voltage V2 at node 50 toward VL. The behavior of driver output signal V1 depicted in FIG. 7 is similar to the behavior of the V1 signal depicted in FIG. 5, except that when control signal D is driven to a 1, feedback controller 66 sets the steady state value of VHIGH so that driver 54 drives V1 to a steady state magnitude somewhat higher than VH in order to keep test signal voltage V2 at the desire high logic level VH. The increased magnitude of V1 compensates for the effects of the low level fault on the test signal voltage V2.

The maximum allowable test signal frequency is a function of the magnitude of isolation resistance R2 needed to provide fault protection, and the magnitudes of VMAX and VMIN voltage limits of driver 54. When VMAX and VMIN are substantially higher (more positive) and lower (more negative) than VH and VL, respectively, the test signal can rapidly move charge into and out of the IC terminal capacitance immediately after D changes state even when R2 is made large to provide fault protection for a large number of IC terminals. Such use of feedback to compensate for faults, allows an increase in the number of IC terminals 38 that can be driven by the same test signal without having to decrease the maximum allowable frequency of the test signal.

Figure 8:
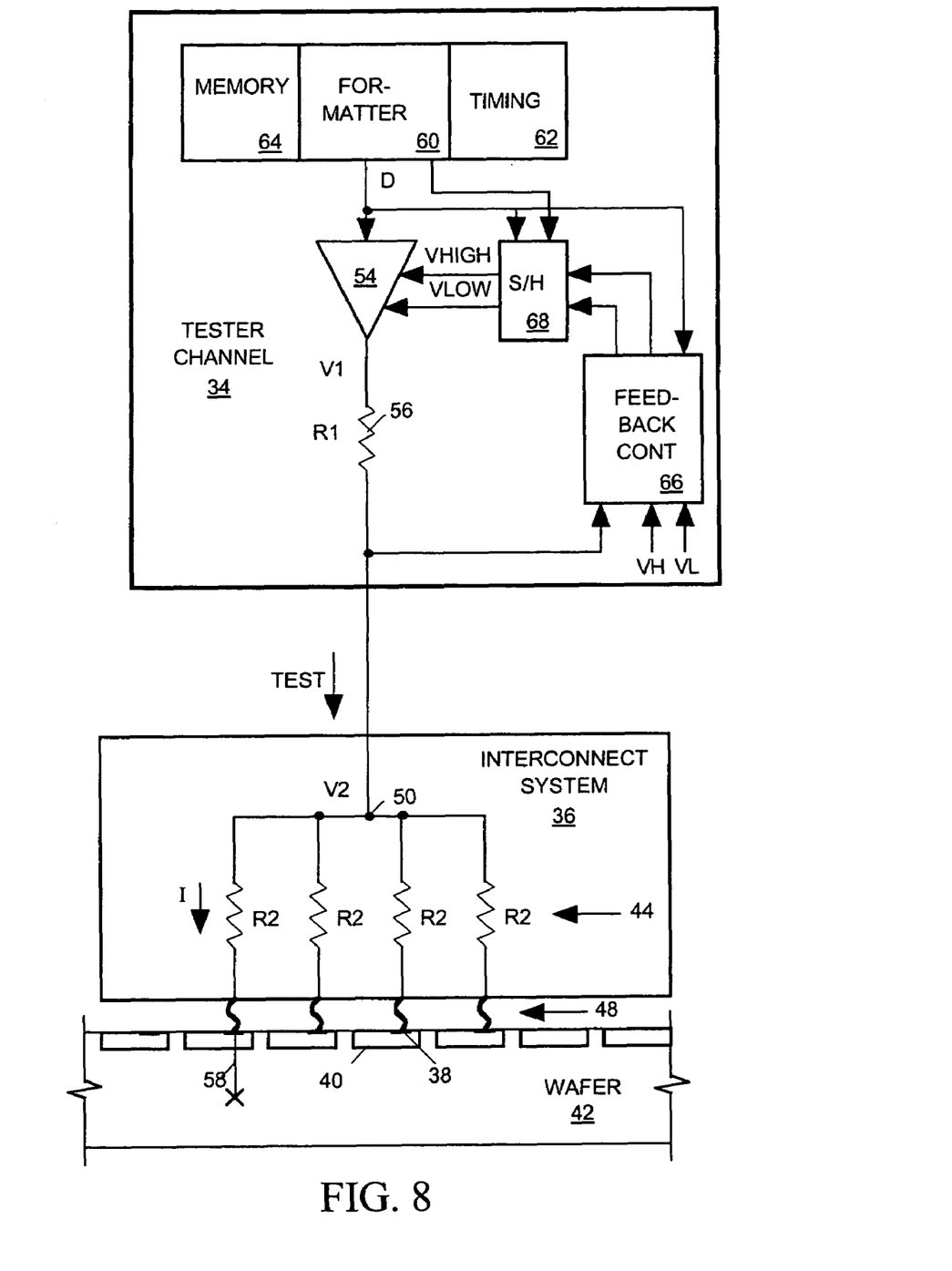
FIG. 8 is a schematic diagram illustrating a portion of one channel of the tester in accordance with a second exemplary embodiment of the invention for transmitting a test signal to a set of IC terminals on a wafer via signals paths provided by an interconnect system.

In some high frequency applications, the response of feedback loop provided by controller 66 of FIG. 3 may be too slow or unstable, or the feedback loop provided by controller 66 may inject unacceptable noise into the test signal. FIG. 8 illustrates how tester channel 34 of FIG. 3 may be adapted for higher frequency operation. As illustrated in FIG. 8 sample and hold circuits 68 controlled by formatter 60 are inserted in the VHIGH and VLOW reference signal paths between controller 66 and driver 54.

Figures 9, 10:
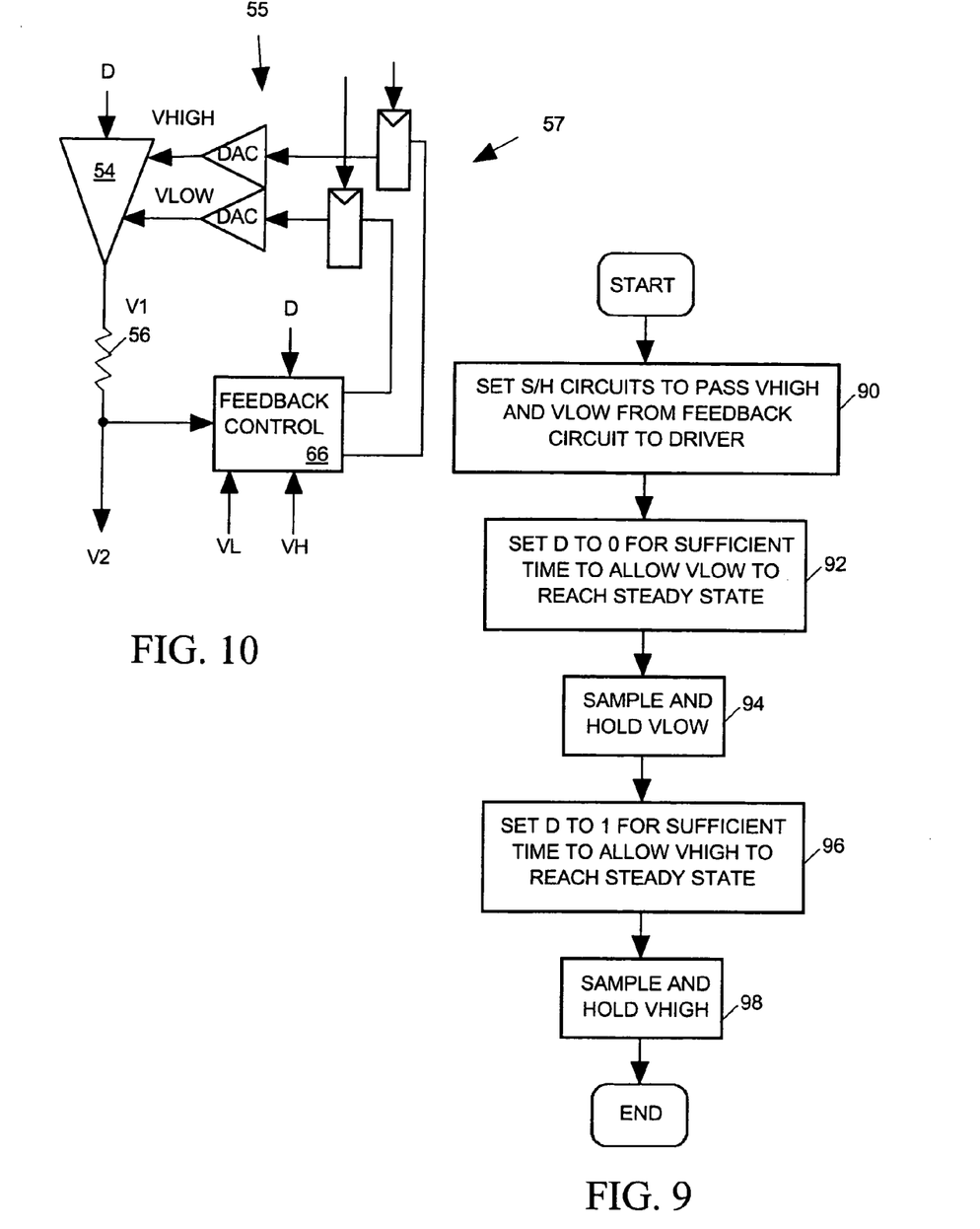
FIG. 9 is a flow chart illustrating behavior of the formatter of FIG. 8 when calibrating the VHIGH and VLOW data values produced by the sample and hold circuits of FIG. 8.
FIG. 10 is a schematic diagram illustrating an alternative system in accordance with a third exemplary embodiment of the invention for controlling the values of VHIGH and VLOW of the tester channel of FIG. 8, FIGS. 11–14 are timing diagrams illustrating behavior of signal V1 of FIG. 8 under various fault conditions at the IC terminals.

FIG. 9 illustrates a calibration procedure formatter 60 conducts before testing ICs 40. Referring to FIGS. 8 and 9, formatter 60 initially sets sample and hold circuits 68 to pass the VLOW and VHIGH output signals of feedback controller 66 directly to driver 54 (step 90). While formatter 60 sets control signal D to a 0 (step 92), feedback controller 66 drives VLOW to a steady state level that is necessary to overcome fault conditions, if any, at any one or more of IC terminals 38. Formatter 60 then signals one of sample and hold circuits 68 to sample and hold that value of VLOW (step 94). Next, formatter 60 drives control signal D to a 1 long enough to allow feedback controller 66 to drive VHIGH to a steady state level necessary to overcome any fault conditions at IC terminals 38 (step 96). Formatter 60 then signals another of sample and hold circuits 68 to retain that VHIGH voltage level (step 98).

Thereafter, during the test of ICs 40, sample and hold circuits 68 hold VHIGH and VLOW to the levels set during the calibration procedure and ignore the outputs of feedback controller 66. Thus during the test, test signal voltage V2 is not controlled by feedback, but the steady state values of driver output signal V1 are nonetheless appropriately adjusted to compensate for faults at IC terminals 38 on test signal voltage V2.

FIG. 10 illustrates an alternative implementation of the feedback control system for driver 54 of FIG. 8. Here feedback control circuit 66 provides digital, rather than analog output data, indicating values of the VHIGH and VLOW signal. During the calibration process the formatter initially sets a pair of latches 57 to pass the data output of feedback controller 66 to inputs of a pair of digital-to-analog converters (DACs) 55 which produce the VHIGH and VLOW signals. However after the data outputs of feedback controller 66 reach steady state during the calibration process, the formatter signals latches 57 to hold the current data values so that VHIGH and VLOW remain fixed during subsequent test process.

Figure 11:
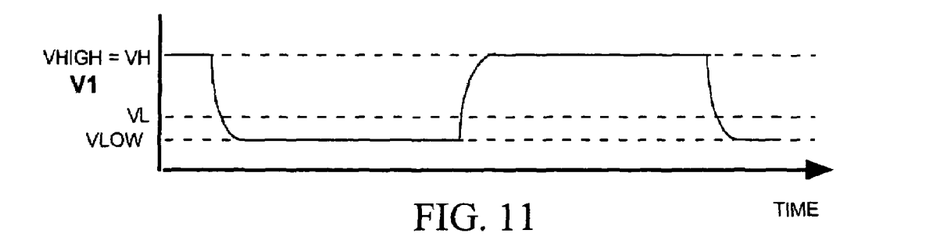

FIG. 11 illustrates the behavior of the V1 signal during the test when high logic level faults at one or more at IC terminals 38 try to pull the test signal voltage V2 toward VH. When the D signal transitions to a 0, the driver 54 drives its output signal voltage V1 as quickly as possible to the magnitude of the VLOW reference signal output of sample and hold circuits 58 that has been preset substantially lower than VL to compensate for the effects of the faults on test signal voltage V2.

Figure 12:
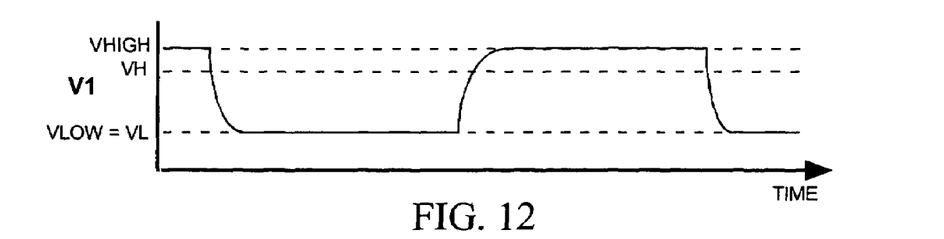

FIG. 12 illustrates the behavior of the V1 signal during the test when low level faults at one or more at IC terminals 38 try to pull test signal voltage V2 toward VL. When the D signal transitions to a 1, the V1 signal rises to the value of the VHIGH reference signal output of sample and hold circuits 58 that has been preset higher than VH so as to compensate for the effects of the faults on test signal voltage V2.

Figure 13:
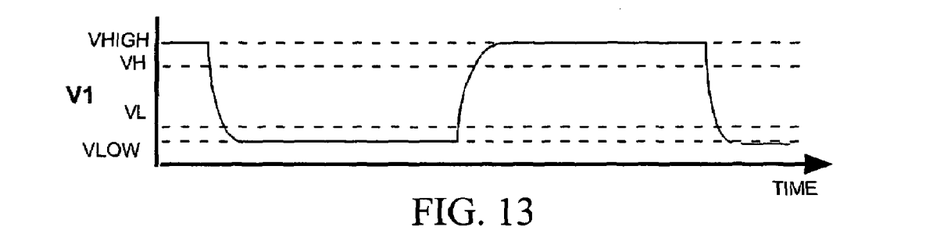

FIG. 13 illustrates the behavior of the V1 signal during the test when high and low level faults at various of IC terminals 38 try to pull test signal voltage V2 somewhere between VH and VL. When the D signal transitions to a 0, the V1 signal falls to the value of the VLOW reference signal output of sample and hold circuits 58 that has been preset lower than VL, and when the D signal transitions to a 1, the V1 signal rises to the value of the VHIGH that has been preset higher than VH.

Figure 14:
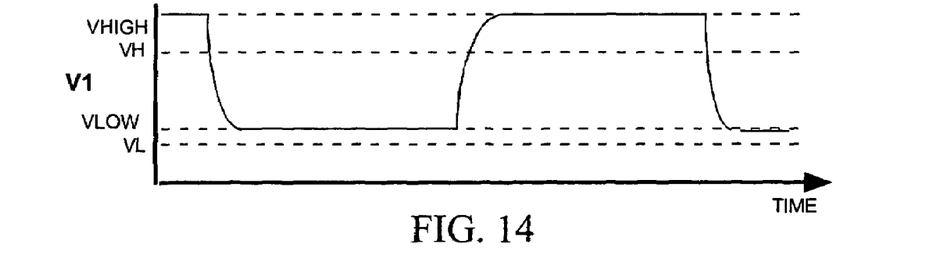

FIG. 14 illustrates the behavior of the V1 signal during the test when faults at one or more of IC terminals 38 try to pull node 50 below VL. When the D signal transitions to a 0, the V1 signal falls to the value of the VLOW reference signal output of sample and hold circuits 58 that has been preset substantially higher than VL, and when the D signal transitions to a 1, the V2 signal rises to the value of the VHIGH that has been preset substantially higher than VH.

One advantage of employing the feedback control system during the test, as depicted in FIG. 3, is that it can temporarily drive the V1 signal to its full range VMAX or VMIN voltage immediately after a state change so as to quickly charge or discharge IC terminal capacitance. This helps to increase the maximum allowable test signal frequency. Since feedback control of V1 does not occur during a test in system of FIG. 8, driver 54 can only drive the V1 signal to the VHIGH or VLOW levels needed to maintain V1 at the proper steady state level. The system of FIG. 8 does not make temporarily use of the full range voltage of driver 54 to speed up IC terminals capacitance charging and discharging.

Figure 15:
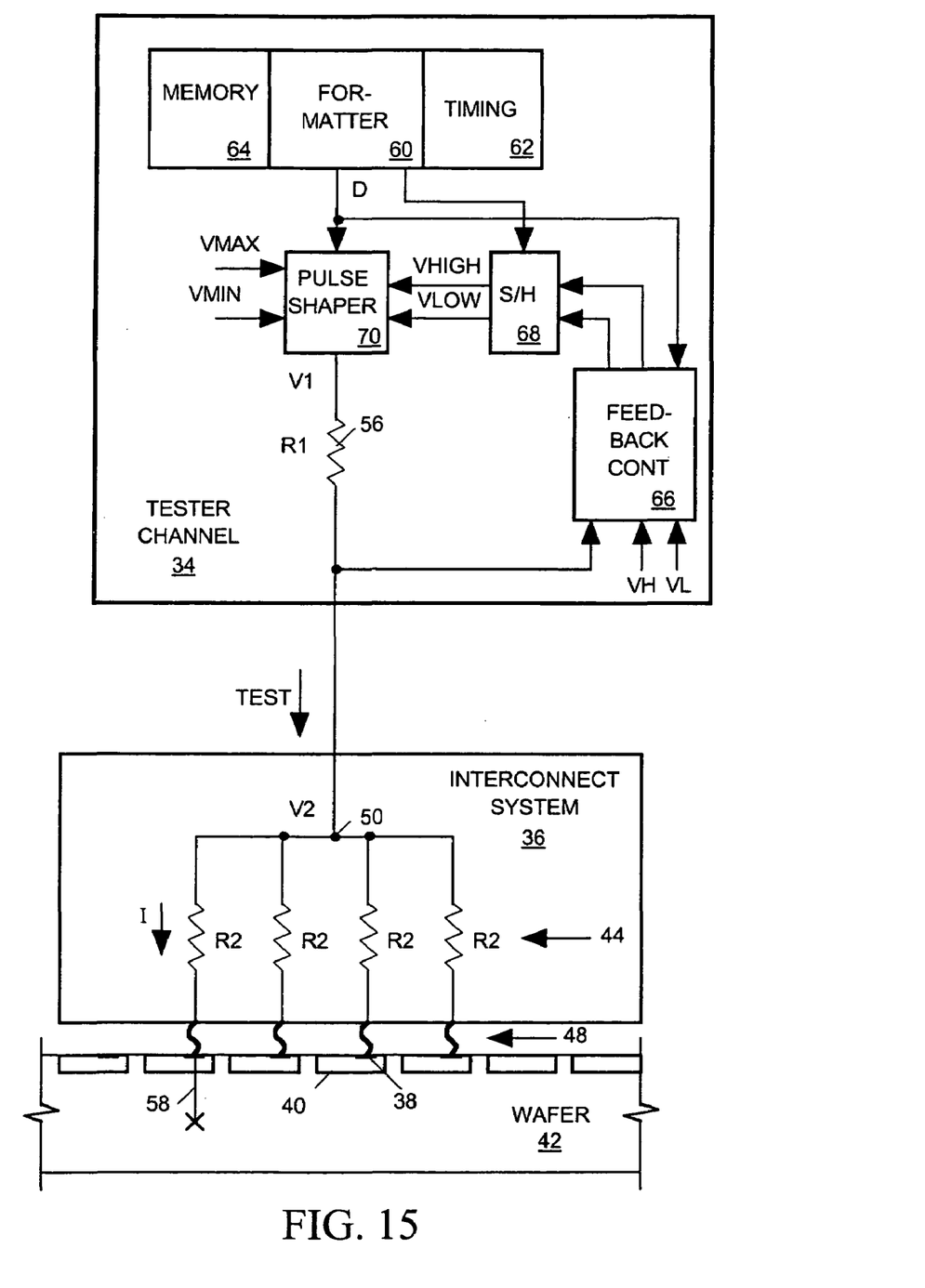
FIG. 15 is a schematic diagram illustrating a portion of one channel of the tester in accordance with a fourth exemplary embodiment of the invention for transmitting a test signal to a set of IC terminals on a wafer via signals paths provided by an interconnect system.

FIG. 15 illustrates another exemplary embodiment of the invention in which driver 54 of FIG. 8 is replaced with a pulse shaper 70. A pulse shaper produces output signal pulses having a desired shape in response to state transmissions at its input signal, and the desired pulse shape need not necessarily be a square wave signal such as that produced by driver 54 of FIG. 8. In this application pulse shaper 70 suitably provides V1 signal pulses that peak at VMAX or VMIN immediately after state changes in its D signal input to provide substantial IC terminal capacitance charging current, and thereafter settle to appropriate steady state levels.

For the test system of FIG. 15, a pretest calibration procedure similar to that used for the test system of FIG. 8 preset the VHIGH and VLOW outputs of sample and hold circuits 68 to levels needed to maintain the steady state test signal voltage V2 at the appropriate high and low logic levels despite any faults at IC terminals 38. Thereafter, when ICs 40 are being tested and the D signal input transitions from a 0 to 1, pulse shaper 70 immediately drives V1 to VMAX to quickly supply charge to IC terminals 38, and thereafter drives V1 down to a steady state value matching VHIGH over a predetermined time interval. When its D signal input transitions from a 1 to a 0, pulse shaper 70 immediately drives V1 to VMIN to quickly remove charge from the IC terminal capacitance, and thereafter pulls V1 up to a steady state value matching VLOW over a predetermined time interval.

Figure 16:
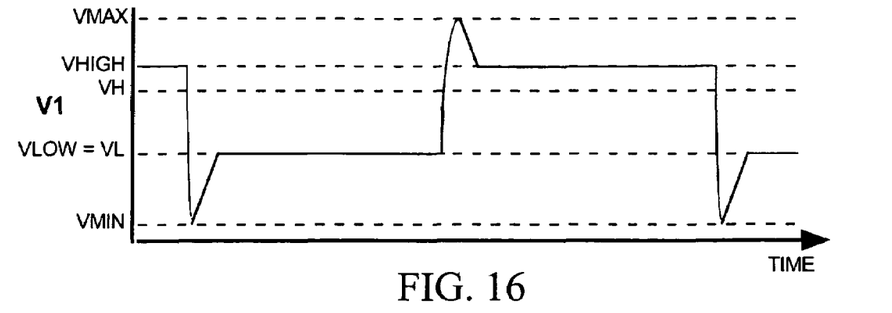
FIGS. 16–19 are timing diagrams illustrating behavior of signal V1 of FIG. 15 under various fault conditions at the IC terminals.

FIG. 16 illustrates the behavior of the V1 signal as the D signal undergoes state changes. In this example faults link the IC terminals 38 to a low logic level (VL) source so that during the calibration procedure, feedback controller 66 sets VHIGH above VH but sets VLOW equal to VL. Thereafter, when ICs 40 are being tested and control signal D transitions to a 0, pulse shaper 70 initially drives V1 to VMIN to quickly remove charge from the IC terminal capacitance, but thereafter ramps V1 back up to VLOW=VL so as to maintain V2 at VL during the steady state portion of the test cycle. When the D signal transitions back to a 1, pulse shaper 70 immediately drives V1 up to VMAX to quickly charge the IC terminal capacitance, and thereafter ramps V1 back down to a steady state level VHIGH, that has been preset higher than VH to compensate for the IC terminal faults.

Figure 17:
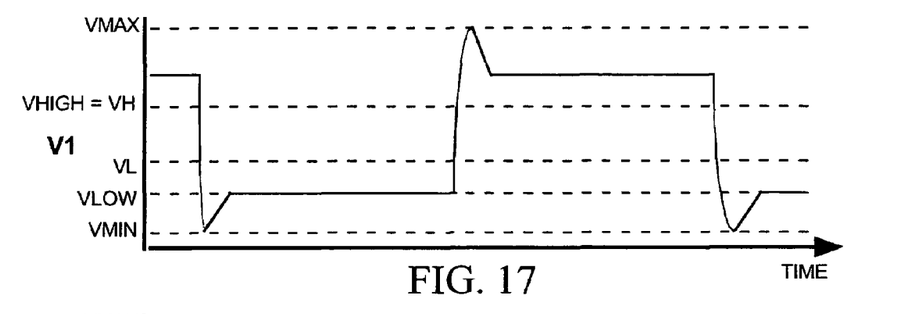
Figure 18:
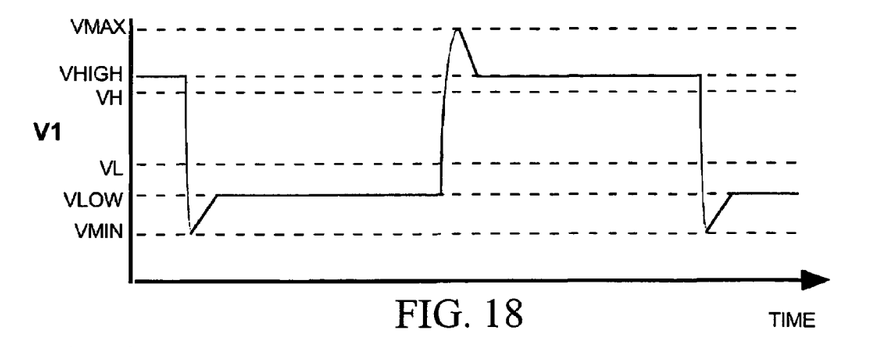

FIG. 17 illustrates the behavior of the V1 signal when one or more terminals 38 are shorted to a source of high logic level VH and FIG. 18 illustrates the behavior of the V1 signal when faults at terminals 38 try to drive V2 to a level somewhere between VL and VH.

Figure 19:
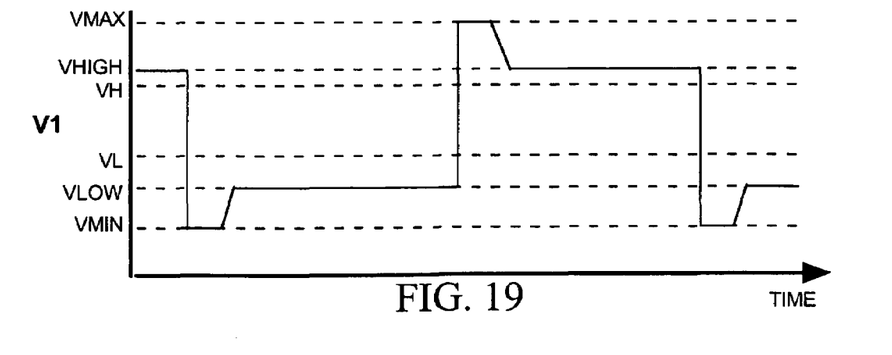

The pulse shapes illustrated in FIGS. 16–18 are exemplary; those of skill in the art will appreciates that a pulse shaper 70 can be provided to shape the V1 signal in any of a variety of ways so as to minimize the total time needed to fully charge or discharge the IC terminal capacitance, thereby to increase the maximum allowable frequency of the test signal. For example, as illustrated in FIG. 19 pulse shaper 70 may hold the V1 signal at VMAX or VMIN for a period of time after each D state transition before driving the V1 signal to VHIGH or VLOW. The sloped portions of the V1 signal may be linear or non-linear.

Although feedback control circuit 66 resides in tester channel 34 in the exemplary embodiments of the invention depicted in FIGS. 3, 8 and 15, it may be located outside channel 34 with leads provided to convey the VHIGH and VLOW signal to the channel.

For simplicity, FIGS. 3, 8 and 15 show isolation resistors 44 as forming a relatively simple network. However the invention may be practiced in connection interconnect systems employing other isolation resistor network topologies, for example as described in U.S. patent application Ser. No. 10/142,549, entitled "Test Signal Distribution System For IC tester," filed May 8, 2002, incorporated herein by reference.

Figure 20:
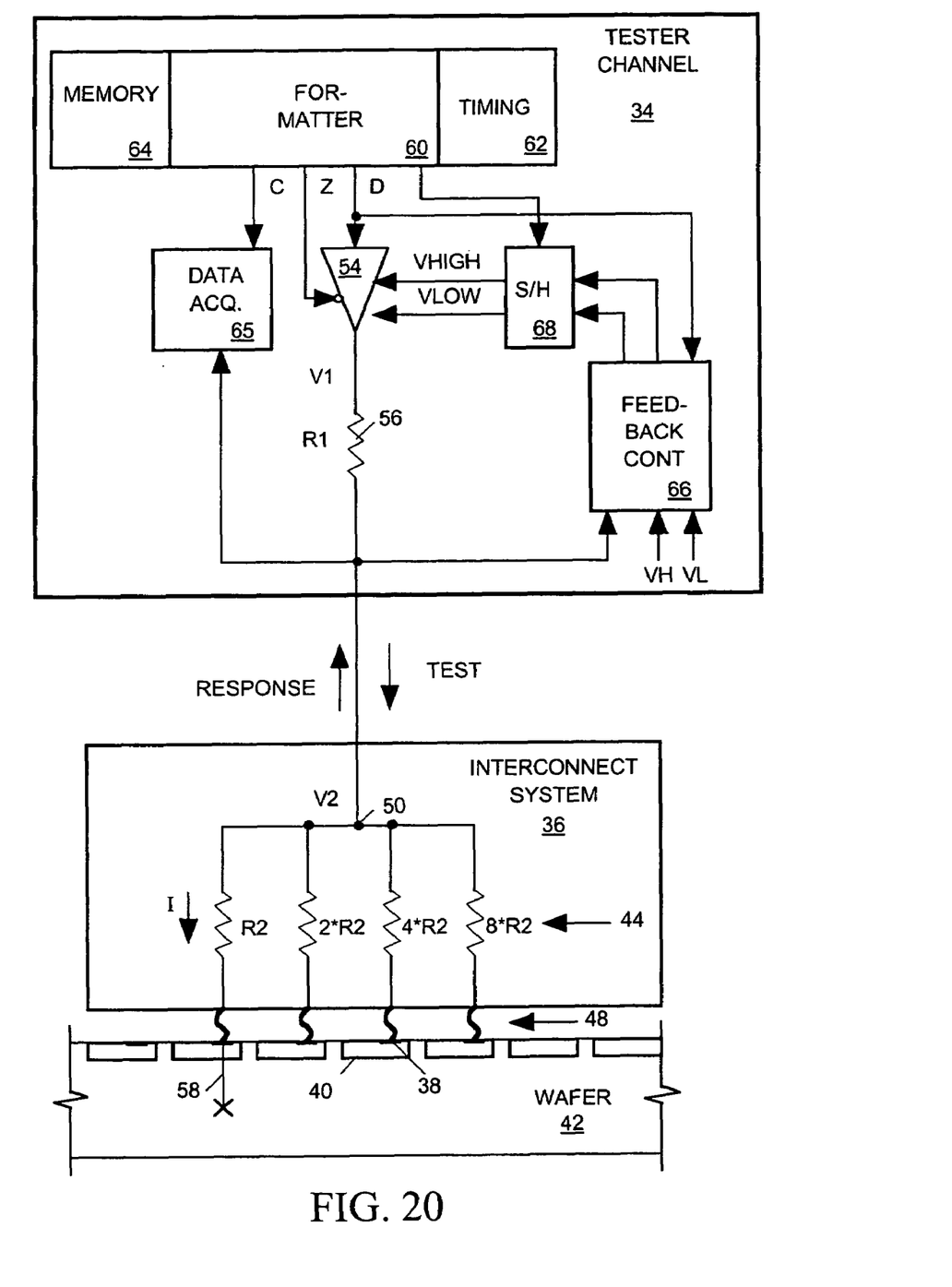
FIG. 20 is a schematic diagram illustrating a portion of one channel of the tester in accordance with a fifth exemplary embodiment of the invention for transmitting a test signal to and receiving response signals from a set of IC terminals on a wafer via signals paths provided by an interconnect system.

It is not necessary that all isolation resistors 44 be of the same value. For example, FIG. 20 depicts a version of a tester channel 34 of FIG. 8 useful when terminals 38 of ICs 40 are bi-directional. IC terminals 38 receive the test signal during some test cycles, while during other test cycles they forward an IC response signal back to tester channel 34. Driver 54 of FIG. 20 is a tristate driver receiving not only a control signal D input from formatter 60 indicating whether to drive its output V1 signal high or low, but also a Z input signal from formatter 60 indicating whether it is to tristate its output signal so that it neither pulls up or down on node 50. During test cycles in which ICs 40 are to send response signals back to tester channel 34, formatter 60 signals driver 54 to tristate its output signal V1. A data acquisition circuit 65 samples the voltage of the response signal in response to a control signal C from formatter 60 and determines the state of the output signal generated by each IC 40 from that response signal voltage.

Interconnect system 36 of FIG. 20 differs from interconnect system 36 of FIG. 8 in that each isolation resistor 44 has a different resistance. In particular, the resistance of each successive isolation resistor 44 is double that of its preceding isolation resistor.

Normally, when all ICs 40 are operating properly, then during test cycles in which they are to generate output signals, all ICs 40 will generate output signals at terminals 38 of the same high or low logic level VH or VL at the same time, and isolation resistors 44 will drive the response signal appearing at node 50 substantially to that high or low logic level. However when one or more of ICs 40 is defective, then at any given time, some of them may produce high logic level (VH) output signals while others produce low logic level (VL) output signals. In such case the response signal voltage seen by data acquisition circuit 65 will be at some level between VH and VL. With the arrangement of isolation resistor values shown in FIG. 20, data acquisition circuit 65 can separately determine the logic state of the output signal at terminal 38 of each IC 40 from the voltage of the response signal.

During any test cycle in which driver 54 transmits the test signal to IC terminal 38, the tester channel of FIG. 20 operates in the same manner as the tester channel of FIG. 8 to compensate for faults at any IC terminal. The method (FIG. 9) used for calibrating the VHIGH and VLOW reference voltages of the tester channel of FIG. 8 may also be used to calibrate the VHIGH and VLOW reference voltage in FIG. 20. Driver 54 of FIG. 20 may also be replaced with a pulse shaper of the type employed in FIG. 15, when the pulse shaper is adapted to provide a tristate output.

While various versions of the invention have been described for use in connection with an IC tester of the type employing a probe card to access terminals of ICs formed on semiconductor wafers, those of skill in the art will appreciate that the invention may be employed in connection with testers employing other types of interface equipment providing access to DUT terminals of ICs that may still be at the wafer level or that have been separated from the wafer on which they were formed and which may or may not be incorporate into IC packages at the time they are tested. Such interface equipment includes, but is not limited to load boards, burn-in boards, and final test boards. The invention in its broadest aspects is not intended to be limited to applications involving any particular type of IC tester, any particular type of tester-to-DUT interconnect system, or any particular type of IC DUT. It should also be understood by those of skill in the art that while the invention is described above as being employed in connection with the testing of integrated circuits, it may also be employed when testing any kind of electronic device including, for example, flip-chip assemblies, circuit boards and the like.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A method for concurrently transmitting a test signal to a plurality of integrated circuit (IC) terminals of ICs during a test of the ICs, wherein a voltage of the test signal repeatedly transitions between first and second test signal voltage levels representing first and second logic levels when a control signal repeatedly transitions between first and second states, wherein at least one fault linking at least one of the plurality of IC terminals to a source of potential has no substantial effect on the first and second logic levels represented by the test signal at others of the IC terminals, the method comprising the steps of:

a. driving an output signal between first and second output signal voltage levels when the control signal transitions between the first and second states,    b. resistively coupling the output signal to a circuit node to produce the test signal at the circuit node,    c. concurrently distributing the test signal from the circuit node to the plurality of IC terminals though paths resistively isolating the IC terminals from one another, and    d. adjusting the first and second output signal voltage levels such that the test signal transitions between the first and second test signal voltage levels when the control signal transitions between said first and second states.

2. The method in accordance with claim 1 wherein the first and second test signal voltage levels are adjusted at step d during the test.

3. The method in accordance with claim 1 wherein the first and second test signal voltage levels are adjusted at step d prior to the test and held constant during the test.

4. The method in accordance with claim 3 wherein the second output signal voltage level is more positive than the first output signal voltage level, and wherein step a comprises the substeps of:
- a1. responding to a change in the control signal from the first state to the second state, by initially driving the output signal voltage substantially more positive than the second output signal voltage level, and thereafter driving the output signal voltage to the second output signal voltage, and
- a2. responding to a change in the control signal from the second state to the first state, by initially driving the output signal voltage substantially more negative than the first output signal voltage level, and thereafter driving the output signal voltage to the first output signal voltage.

5. The method in accordance with claim 1 wherein step d comprises the substeps of:
- d1. performing a first comparison between the test signal voltage and a first reference voltage when the control signal is of the first state
- d2. adjusting first data in response to the first comparison,
- d3. performing a second comparison between the test signal voltage and a second reference voltage when the control signal is of the second state,
- d4. adjusting second data in response to the second comparison,
- d5. storing the first and second data adjusted at steps d1 and d3, and
- d6. controlling the first and second output signal voltage levels in response to the stored first and second data.

6. The method in accordance with claim 5
wherein step d5 occurs prior to the test, and
wherein the first and second output signal voltage levels remain constant during the test.

7. The method in accordance with claim 1 wherein step d comprises the substeps of:
- d1. during the test, performing a first comparison between the test signal voltage and a first reference voltage and adjusting the first output signal voltage level in accordance with the first comparison when the control signal is of the first state, and
- d2. during the test, performing a second comparison between the test signal voltage and a second reference voltage and adjusting the second output signal voltage level in accordance with the second comparison when the control signal is of the second state.

8. The method in accordance with claim 1 wherein step d comprises the substeps of:
- d1. prior to the test, performing a first comparison between the test signal voltage and a first reference voltage when the control signal is of the first state;
- d2. prior to the test, adjusting the first output signal voltage level in accordance with the first comparison;
- d3. prior to the test, performing a second comparison between the test signal voltage and a second reference voltage when the control signal is of the second state;
- d4. prior to the test, adjusting the second output signal voltage level in accordance with the second comparison; and
- d5. during the test, the refraining from further adjusting the first and second output signal voltage levels.

* * * * *